(12) United States Patent
Tanaka et al.

(10) Patent No.: US 8,475,668 B2
(45) Date of Patent: Jul. 2, 2013

(54) SUBSTRATE LIQUID PROCESSING APPARATUS, SUBSTRATE LIQUID PROCESSING METHOD, AND STORAGE MEDIUM HAVING SUBSTRATE LIQUID PROCESSING PROGRAM STORED THEREIN

(75) Inventors: Hiroshi Tanaka, Koshi (JP); Teruomi Minami, Koshi (JP); Yosuke Kawabuchi, Koshi (JP); Norihiro Ito, Koshi (JP); Fumihiro Kamimura, Koshi (JP); Takashi Yabuta, Koshi (JP); Kazuki Kosai, Beaverton, OR (US); Takeshi Uno, Koshi (JP); Kenji Sekiguchi, Nirasaki (JP); Yasushi Fujii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 296 days.

(21) Appl. No.: 12/902,721

(22) Filed: Oct. 12, 2010

(65) Prior Publication Data

US 2011/0089137 A1 Apr. 21, 2011

(30) Foreign Application Priority Data

Oct. 16, 2009 (JP) .................................. 2009-239452
Aug. 12, 2010 (JP) .................................. 2010-180668

(51) Int. Cl.
*H01B 13/00* (2006.01)

(52) U.S. Cl.
USPC ............. 216/13; 134/25.4; 134/28; 134/95.3; 134/32

(58) Field of Classification Search
USPC ....................... 216/13; 134/25.4, 28, 95.3, 32
See application file for complete search history.

(56) References Cited

U.S. PATENT DOCUMENTS

| | | | | |
|---|---|---|---|---|
| 4,048,118 A | * | 9/1977 | Suzaka et al. | 252/519.21 |
| 5,525,261 A | * | 6/1996 | Incorvia et al. | 252/500 |
| 6,709,531 B2 | * | 3/2004 | Ito et al. | 134/21 |
| 7,534,302 B2 | * | 5/2009 | Kim et al. | 134/6 |
| 2010/0024847 A1 | * | 2/2010 | Breese et al. | 134/25.4 |

FOREIGN PATENT DOCUMENTS

JP 2004-356593 A 12/2004

* cited by examiner

*Primary Examiner* — Nadine Norton
*Assistant Examiner* — Maki Angadi
(74) *Attorney, Agent, or Firm* — Abelman, Frayne & Schwab

(57) ABSTRACT

Provided are a substrate liquid processing apparatus, a substrate liquid processing method, and a computer readable storage medium having a substrate liquid processing program stored therein that can prevent the occurrence of the electrostatic breakdown caused by the discharge of electric charges in a substrate. The substrate liquid processing apparatus processes a circuit-forming surface of the substrate with a chemical liquid. Furthermore, prior to processing the substrate with the chemical liquid, the substrate liquid processing apparatus performs an anti-static process for an surface opposite to the circuit-forming surface of the substrate by an anti-static liquid, thereby emitting the electric charges on the substrate.

6 Claims, 6 Drawing Sheets

SUBSTRATE LIQUID PROCESSING APPARATUS, SUBSTRATE LIQUID PROCESSING METHOD, AND STORAGE MEDIUM HAVING SUBSTRATE LIQUID PROCESSING PROGRAM STORED THEREIN

This application is based on and claims priority from Japanese Patent Application No. 2009-239452 filed on Oct. 16, 2009 and No. 2010-180668 filed on Aug. 12, 2010 with the Japanese Patent Office, the disclosures of both of which are incorporated herein in their entirety by reference.

TECHNICAL FIELD

The present disclosure relates to a substrate liquid processing apparatus, a substrate liquid processing method and a storage medium having a substrate liquid processing program stored therein for processing a substrate by a processing liquid.

BACKGROUND

Conventionally, a substrate liquid processing apparatus is used to perform a cleaning process or an etching process to a substrate such as a semiconductor wafer or a liquid crystal substrate by a cleaning agent or an etching agent when manufacturing a semiconductor component or a flat panel display.

In the substrate liquid processing apparatus, a substrate processed by the apparatus or members included in the apparatus may be electrostatically charged due to various reasons such as the charge of a processing liquid or the friction of moving parts.

Additionally, when the substrate or the members are charged with electricity, an electrostatic breakdown may occur at the circuit-forming surface of the substrate (a surface at which electronic elements, such as a transistor or a diode, or a wiring connecting them is formed) when the electric charge is discharged.

Thus, in the conventional substrate liquid processing apparatus, a chuck made of a conductive material is provided adjacent to the peripheral edge of the substrate to maintain the substrate during the liquid processing, and the charged electricity on the substrate is emitted through the conductive chuck. See, for example, Japanese Patent Application Laid Open No. 2004-356593.

As the conventional substrate liquid processing apparatus is configured to emit the electric charge on the substrate by the chuck that maintains the substrate, the electric charge at the surface layer of the substrate may partially be discharged to outside. However, the electric charge at the inside of the substrate may not be discharged effectively to the outside of the substrate. As a result, there is a concern that an electrostatic breakdown may occur at the circuit-forming surface of the substrate when the circuit-forming surface of the substrate is processed with a chemical liquid and remaining electric charges are discharged.

SUMMARY

According to an embodiment, the present disclosure provides a substrate liquid processing apparatus, comprising a substrate maintaining device that maintains a substrate, a first processing liquid supply device that supplies a processing liquid to a circuit-forming surface of the substrate maintained by the substrate maintaining device, a second processing liquid supply device that supplies the processing liquid toward a surface opposite to the circuit-forming surface of the substrate maintained by the substrate maintaining device, and a controller that controls the substrate maintaining device, the first processing liquid supply device, and the second processing liquid supply device. In particular, the controller controls the substrate liquid processing apparatus to perform a liquid process in which a chemical liquid is supplied from the first processing liquid supply device toward the circuit-forming surface of the substrate thereby processing the substrate with the chemical liquid, and to perform an anti-static process, before the liquid process, in which an anti-static liquid is supplied from the second processing liquid supply device toward the surface opposite to the circuit-forming surface of the substrate thereby processing the substrate with the anti-static liquid where the electric charges are emitted from the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
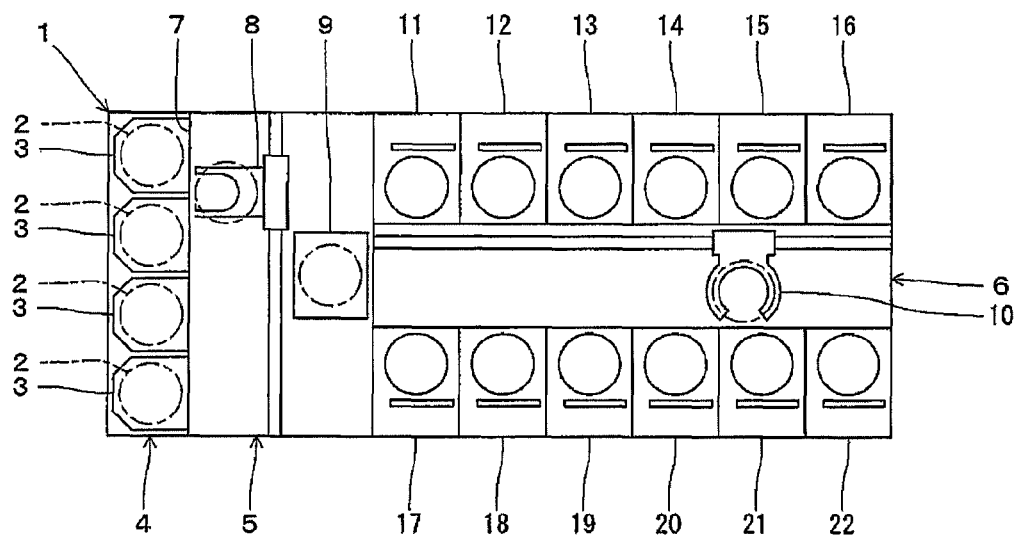
FIG. 1 is a plan view of the substrate liquid processing apparatus according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the sprit or scope of the subject matter presented here.

According to an embodiment of the present disclosure, there is provided a substrate liquid processing apparatus, comprising a substrate maintaining device that maintains a substrate, a first processing liquid supply device that supplies a processing liquid to a circuit-forming surface of the substrate maintained by the substrate maintaining device, a second processing liquid supply device that supplies the processing liquid toward a surface opposite to the circuit-forming surface of the substrate maintained by the substrate maintaining device, and a controller that controls the substrate maintaining device, the first processing liquid supply device, and the second processing liquid supply device. In particular, the controller controls the substrate liquid processing apparatus to perform a liquid process in which a chemical liquid is supplied from the first processing liquid supply device toward the circuit-forming surface of the substrate thereby processing the substrate with the chemical liquid, and to perform an anti-static process, before the liquid process, in which an anti-static liquid is supplied from the second processing liquid supply device toward the surface opposite to the circuit-forming surface of the substrate thereby processing the substrate with the anti-static liquid where the electric charges are emitted from the substrate.

Also, in the substrate liquid processing apparatus, prior to the anti-static process, the controller may control the substrate liquid processing apparatus to perform a preliminary process in which deionized water (DIW) serving as a processing liquid is supplied from the first processing liquid supply device and the second processing liquid supply device toward the substrate while rotating the substrate maintaining device thereby forming a thin film of deionized water on the surface of the substrate.

Also, in the substrate liquid processing apparatus, the conductivity of deionized water may be lower than that of the anti-static liquid.

Also, in the substrate liquid processing apparatus, the conductivity of the anti-static liquid may be the same as or higher than that of the chemical liquid used for processing the circuit-forming surface of the substrate.

Also, in the substrate liquid processing apparatus, the anti-static liquid may be the chemical liquid for processing the circuit-forming surface of the substrate.

Also, in the substrate liquid processing apparatus, after the liquid process, a mist phase of a mixture of a rinse liquid for rinsing the substrate and a gas may be supplied from the second processing liquid supply device to the substrate as a processing liquid.

Also, in the substrate liquid processing apparatus, a substrate maintaining body configured to abut and maintain the substrate may be formed with a conductive material and may be electrically grounded in the substrate maintaining device.

Also, in the substrate liquid processing apparatus, a processing liquid ejecting tube configured to eject the processing liquid may be formed with a conductive material, and may be electrically grounded in either one of the first processing liquid supply device or the second processing liquid supply device, or both of them.

Also, in the substrate liquid processing apparatus, the substrate maintaining device may include a substrate transfer unit, and a maintaining body configured to abut and maintain the substrate may be provided at the substrate transfer unit. In particular, the maintaining body may be formed of a conductive material and may be electrically grounded.

Also, according to another embodiment of the present disclosure, there is provided a substrate liquid processing method comprising processing a substrate with a chemical liquid supplied from a first processing liquid supply device toward a circuit-forming surface of the substrate, and performing an anti-static process, prior to the processing step, by ejecting an anti-static liquid from a second processing liquid supply device toward a surface opposite to the circuit-forming surface thereby emitting electric charges from the surface opposite to the circuit-forming surface of the substrate.

Also, the liquid processing method further comprises, prior to the anti-static process, performing a preliminary process in which deionized water serving as a processing liquid is supplied toward the substrate while rotating the substrate thereby forming a thin film of deionized water on the surface of the substrate.

Also, in the liquid processing method, the conductivity of deionized water may be lower than that of the anti-static liquid.

Also, in the liquid processing method, the conductivity of the anti-static liquid may be the same as or higher than that of the chemical liquid used for processing the circuit-forming surface of the substrate.

Also, in the liquid processing method, the anti-static liquid may be the chemical liquid used for processing the circuit-forming surface of the substrate.

Also, the liquid processing method further comprises ejecting a mist phase of a mixture of a rinse liquid for rinsing the substrate and a gas from the second processing liquid supply device toward a surface opposite to the circuit-forming surface of the substrate, after the processing step.

Also, according to yet another embodiment of the present disclosure, there is provided a computer readable storage medium storing a computer executable program that, when executed, causes a computer to perform processing a substrate with a chemical liquid supplied from a first processing liquid supply device toward a circuit-forming surface of the substrate, and performing an anti-static process, prior to the processing step, by ejecting an anti-static liquid from a second processing liquid supply device toward a surface opposite to the circuit-forming surface thereby emitting electric charges from the surface opposite to the circuit-forming surface of the substrate.

Also, in the computer readable storage medium, prior to the anti-static process, the controller controls to perform a preliminary process in which deionized water serving as a processing liquid is supplied toward the substrate while rotating the substrate thereby forming a thin film of deionized water on the surface of the substrate.

According to the embodiments of the present disclosure, an anti-static process is performed on the surface opposite to the circuit-forming surface of the substrate using an anti-static liquid prior to performing a chemical liquid process for processing the circuit-forming surface of the substrate with a chemical liquid. As a result, the electric charges in the substrate are discharged from the surface opposite to the circuit-forming surface of the substrate and an electrostatic breakdown can be prevented from occurring.

Hereinafter, with reference to the drawings, descriptions will be made for the substrate liquid processing apparatus, the substrate liquid processing method using the substrate liquid processing apparatus, and the substrate liquid processing program for performing a substrate liquid processing by the substrate liquid processing apparatus according to the present disclosure.

As shown in FIG. 1, in a substrate liquid processing apparatus 1, a substrate load/unload board 4 is formed at its front end portion for gathering a plurality of (e.g., 25 pieces) substrates 2 (e.g., semiconductor wafers) and for loading/unloading substrates 2 to/from a carrier 3. In substrate liquid processing apparatus 1, a substrate transfer chamber 5 is also formed at the rear end portion of load/unload board 4 for transferring substrates 2 received at carrier 3 one by one, and further a single-wafer type substrate processing chamber 6 is formed at the rear end portion of substrate transfer chamber 5 for cleaning and drying substrates 2.

Load/unload board 4 has four carriers 3 that are disposed while being spaced from each other in the right and the left and close to a front wall 7 of substrate transfer chamber 5.

Substrate transfer chamber 5 includes a substrate transfer device 8 and a substrate delivery board 9 therein, and is configured to transfer substrates 2 one by one between any one carrier 3 disposed in load/unload board 4 and substrate delivery board 9 by substrate transferring device 8.

Substrate processing chamber 6 includes a substrate transfer device 10 at the center thereof, first to sixth substrate processing units 11-16 in the left side of substrate transfer device 10 side by side, and seventh to twelfth substrate processing units 17-22 in the right side of substrate transfer device 10 side by side along the forward and backward direction.

Additionally, in substrate processing chamber 6, substrates 2 are transferred one by one between substrate delivery board 9 of substrate transfer chamber 5 and each substrate processing unit 11-22 by substrate transfer device 10, and substrates 2 are processed in one by one by each substrate processing unit 11-22.

Figure 2:
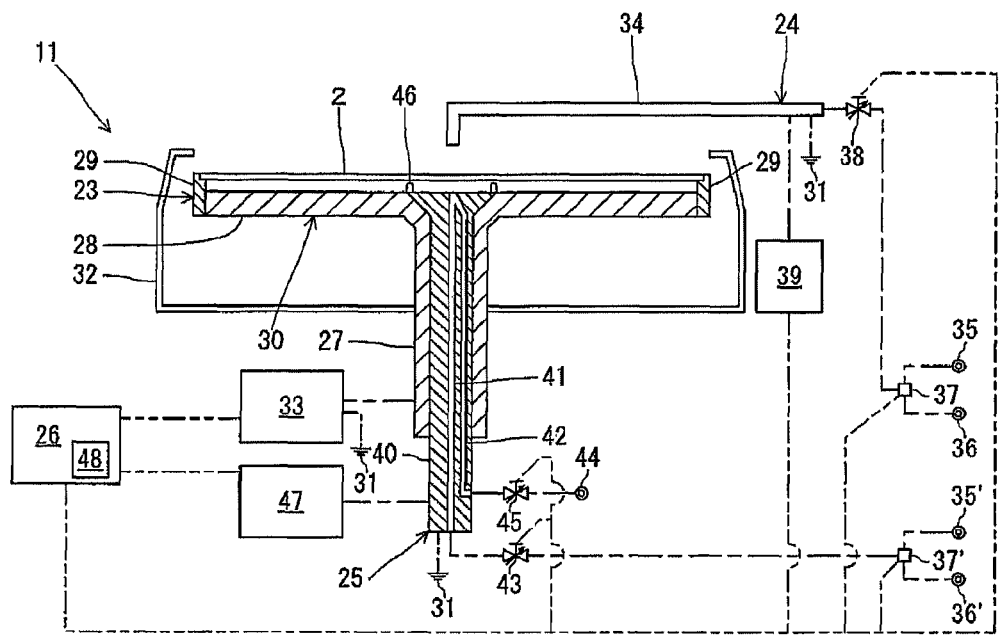
FIG. 2 is a schematic view of a substrate processing unit.

Each substrate processing unit 11-22 has the same constitution. As shown in FIG. 2, substrate processing unit 11, as a representative example, includes a substrate maintaining device 23 for horizontally maintaining a substrate 2, a first processing liquid supply device 24 that supplies a processing liquid to a circuit-forming surface (upper surface) of substrate 2 maintained by substrate maintaining device 23, and a second processing liquid supply device 25 that supplies the processing liquid to a surface opposite to the circuit-forming surface (lower surface) of substrate 2 maintained by substrate maintaining device 23. Substrate processing unit 11 further includes a controller 26 that controls substrate maintaining device 23, and first and second processing liquid supply devices 24, 25. Also, controller 26 is configured to control the entire substrate liquid processing apparatus 1, including substrate transfer devices 8, 10.

In substrate maintaining device 23, a table 28 having a disk shape is horizontally formed at the upper portion of a hollow cylindrical rotating axis 27. Substrate maintaining device 23 attaches a plurality of substrate maintaining bodies 29, that maintain substrate 2 horizontally while abutting to the peripheral edge of substrate 2, to the peripheral edge of table 28 to be spaced each other along the circumferential direction, so that they form a rotatable base 30. Herein, in base 30, substrate maintaining body 29 is formed with a conductive material, such as conductive fluorine resins including carbon fiber, and rotating axis 27 and table 28 is formed with a conductive material so that base 30 can be electrically grounded by a rotating driver 33 which will be described below.

Also, substrate maintaining device 23 encases base 30 with a cup having an opening in the upper portion, so that the scattering of the processing liquid can be prevented.

Also, in substrate maintaining device 23, a rotating axis 27 of base 30 is interconnected to a rotating driver 33, so that base 30 and substrate 2 maintained by base 30 are rotated by rotating driver 33. The rotation of rotating driver 33 is controlled by controller 26.

In first processing liquid supply device 24 a first processing liquid ejecting tube 34 is disposed at the upper side than base 30 (table 28) and first processing liquid ejecting tube 34 is connected to deionized water supplier 35 for supplying deionized water and a chemical liquid supplier 36 for supplying chemical cleaning liquid through a converter 37 and a flow controller 38, so that a predetermined amount of either the deionized water or a chemical cleaning liquid can be selectively supplied as a processing liquid from first processing liquid ejecting tube 34 to a circuit-forming surface (upper surface) of substrate 2. Herein, converter 37 and flow controller 38 are controlled by controller 26. Also, in first processing liquid supply device 24 first processing liquid ejecting tube 34 is formed with a conductive material, such as conductive fluorine resins including carbon fiber, and is connected to an earth 31 to be electrically grounded.

Also, in first processing liquid supply device 24, first processing liquid ejecting tube 34 is interconnected to a moving part 39, so that first processing liquid ejecting tube 34 can be moved from the center of substrate 2 to the peripheral edge of substrate 2 and can be moved backward to the outer side than the peripheral edge of substrate 2 by moving part 39. Moving part 39 is controlled by controller 26.

In second processing liquid supply device 25, a second processing liquid ejecting tube 40 is disposed at the lower side than base 30 (table 28), a liquid path 41 is formed at the center of second processing liquid ejecting tube 40, and a gas path 42 interconnectable with liquid path 41 is formed at the front end portion (an upper portion) of second processing liquid ejecting tube 40. A deionized water supplier 35' which may be the same as deionized water supplier 35 and a chemical liquid supplier 36' which may be the same as chemical liquid supplier 36 are connected to liquid path 41 through a converter 37' and a flow controller 43. A gas supplier 44 for supplying inert gas, such as nitrogen gas, is connected to gas path 42 through a flow controller 45. Additionally, second processing liquid supply device 25 can selectively eject a predetermined amount of either deionized water or a chemical cleaning liquid from liquid path 41 of second processing liquid ejecting tube 40 to a surface opposite to the circuit-forming surface (lower surface) of substrate 2 as a processing liquid. Also, second processing liquid supply device 25 can selectively eject a predetermined amount of a mist phase of a mixture of deionized water and a chemical cleaning liquid from liquid path 41 and gas path 42 of second processing liquid ejecting tube 40 to the surface opposite to the circuit-forming surface (lower surface) of substrate 2 as a processing liquid. Herein, flow controllers 43, 45 are controlled by controller 26.

In second processing liquid supply device 25, second processing liquid ejecting tube 40 is elevatably accommodated with a space at the hollow portion in the center of base 30 of substrate maintaining device 23, a plurality of protruding-shape maintaining bodies 46 are attached to the front end peripheral edge (upper end peripheral edge) of second processing liquid ejecting tube 40 with a space along the circumferential direction, and second processing liquid ejecting tube 40 is interconnected to an elevator 47. As a result, second processing liquid ejecting tube 40 is elevated by elevator 47. Elevator 47 is controlled by controller 26.

Additionally, when second processing liquid supply device 25 receives substrate 2 from substrate transfer device 10 or delivers substrate 2 to substrate transfer device 10, second processing liquid ejecting tube 40 is ascended to the upper side than substrate maintaining device 23 thereby maintaining the lower side of substrate 2 by maintaining body 46. Also, second processing liquid ejecting tube 40 is made to a descending state thereby maintaining the peripheral edge of substrate 2 by substrate maintaining body 29 of substrate maintaining device 23. Also, the front end portion (upper end portion) of maintaining body 46 is spaced away from the lower surface of substrate 2 when second processing liquid ejecting tube 40 is in a descending state.

Thus, second processing liquid supply device 25 has the function of ejecting a processing liquid to the surface opposite to the circuit-forming surface (lower surface) of substrate 2 and functions as a substrate transfer device as well to transfer substrate 2 between substrate transfer device 10 and substrate maintaining device 23. Also, in second processing liquid supply device 25, second processing liquid ejecting tube 40 and maintaining body 46 are formed with a conductive material, such as conductive fluorine resins including carbon fiber, and connected to earth 31 to be electrically grounded.

Also, substrate liquid processing apparatus 1 utilizes deionized water, as deionized water supplied from deionized water supplier 35, with an improved conductivity higher than that of the super deionized water by dissolving carbon dioxide or ammonia gas etc., into the super deionized water. Substrate liquid processing apparatus 1 utilizes a chemical liquid, as the cleaning chemical liquid supplied from chemical liquid supplier 36, having a higher conductivity than that of deionized water supplied from deionized water supplier 35. Thus, in substrate liquid processing apparatus 1, deionized water supplied by deionized water supplier 35 can easily discharge the electric charges in substrate 2 as compared to the super deionized water, and the cleaning chemical liquid supplied from chemical liquid supplier 36 can easily discharge the electric charges in substrate 2 as compared to deionized water supplied from deionized water supplier 35.

Substrate liquid processing apparatus 1 is constituted as described above and is configured to processes substrate 2 in each substrate processing unit 11-22 based on a substrate liquid processing program recorded on storage medium 48 readable by controller 26 (a computer). Also, storage medium 48 may be a medium capable of storing various programs such as a substrate liquid processing program. Storage medium 48 may also be a semiconductor memory type storage medium, such as ROM or RAM, or a disk type storage medium, such as a hard disk or CD-ROM.

Figure 10:
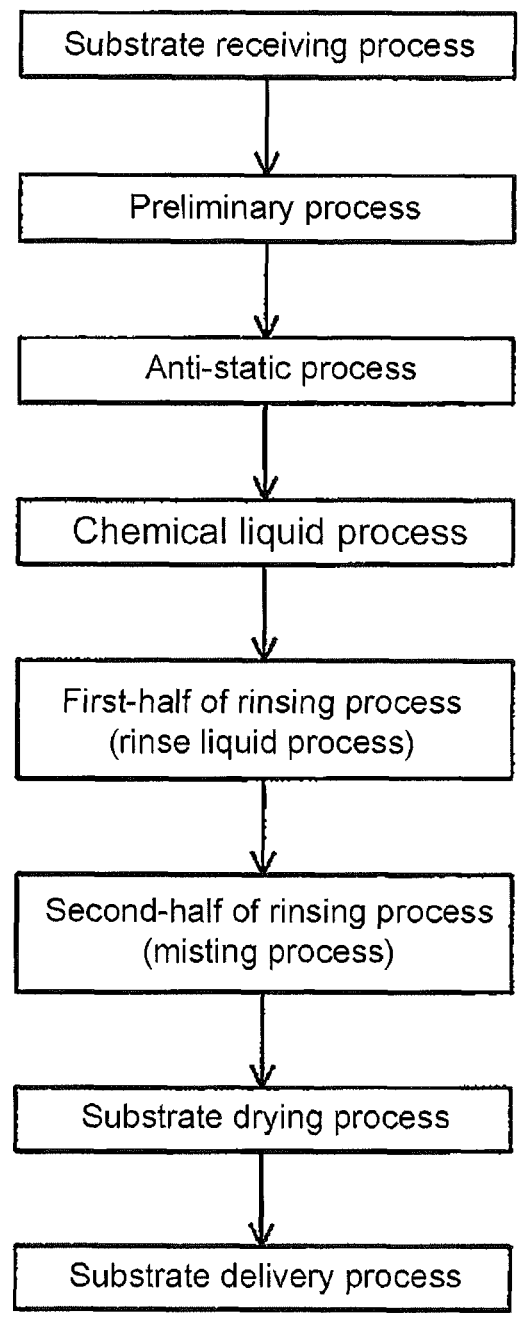
FIG. 10 is a flow chart illustrating the substrate liquid processing method according an embodiment of the present disclosure.

In substrate liquid processing apparatus 1, a liquid process (herein, a cleaning process) of substrate 2 is performed according to the flow chart in FIG. 10 as described below by the substrate liquid processing program.

Figure 3:
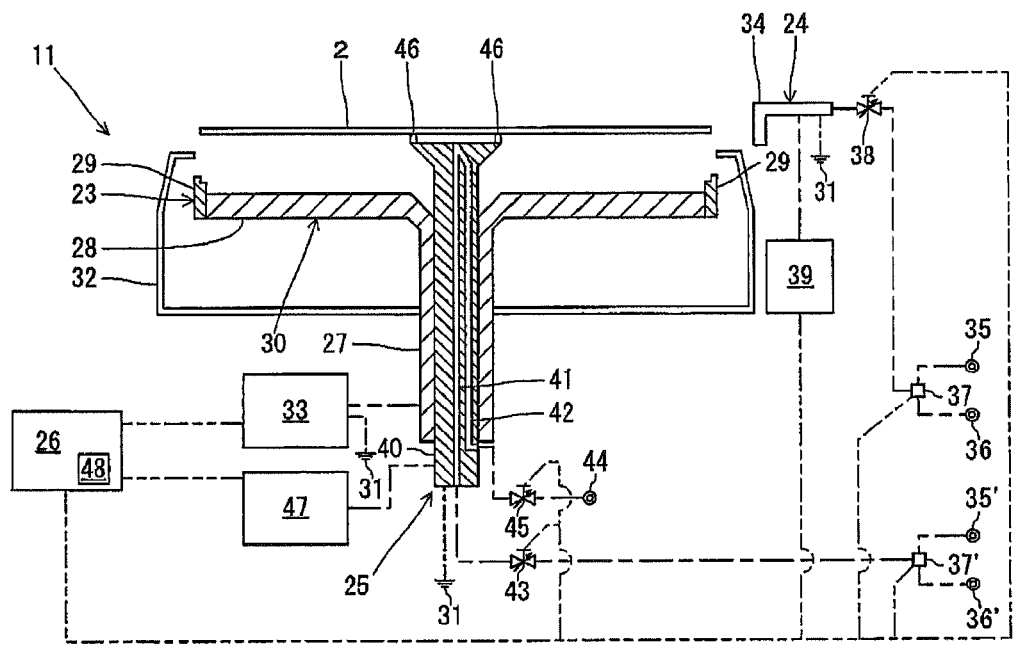
FIG. 3 is a diagram illustrating the operation of the substrate receiving process of FIG. 2.
Figure 4:
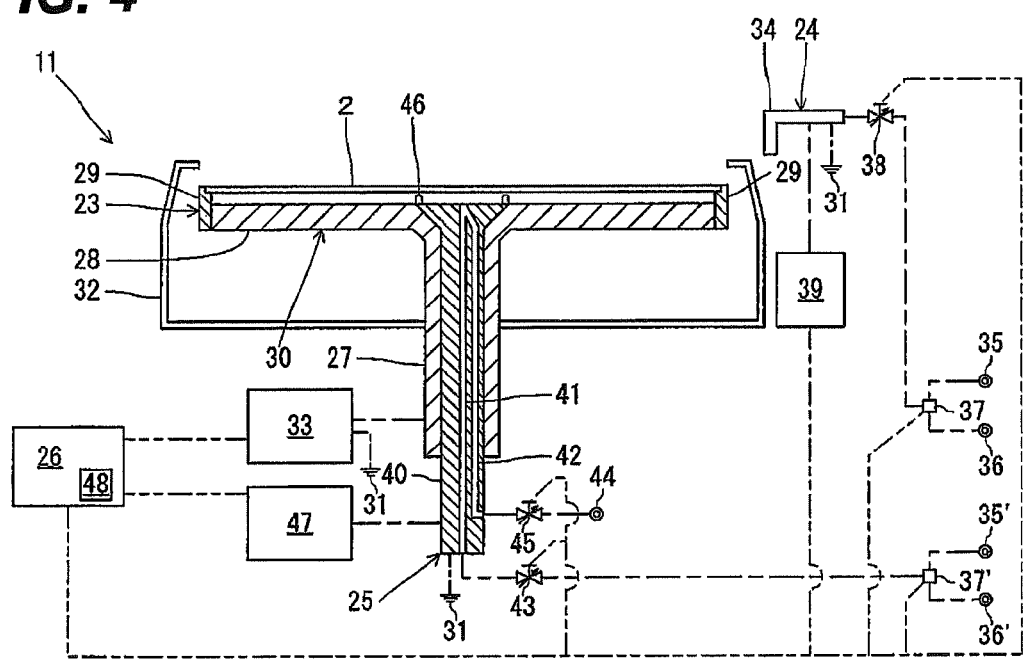
FIG. 4 is a diagram illustrating the operation of the substrate receiving process of FIG. 2.

First, as shown in FIG. 3, the substrate liquid processing program controls moving part 39 by controller 26 to retreat first processing liquid ejecting tube 34 to the outer side than the peripheral edge of substrate 2. The substrate liquid processing program then controls elevator 47 by controller 26 to elevate second processing liquid ejecting tube 40 serving as a substrate transfer part thereby receiving substrate 2 from substrate transfer device 10 and maintaining substrate 2 by maintaining body 46. Thereafter, as shown in FIG. 4, the substrate liquid processing program controls elevator 47 by controller 26 to descend second processing liquid ejecting tube 40 serving as a substrate transfer part to deliver substrate 2 to substrate maintaining body 29 of substrate maintaining device 23, and to maintain substrate 2 by maintaining body 29 (a substrate receiving process).

Figure 5:
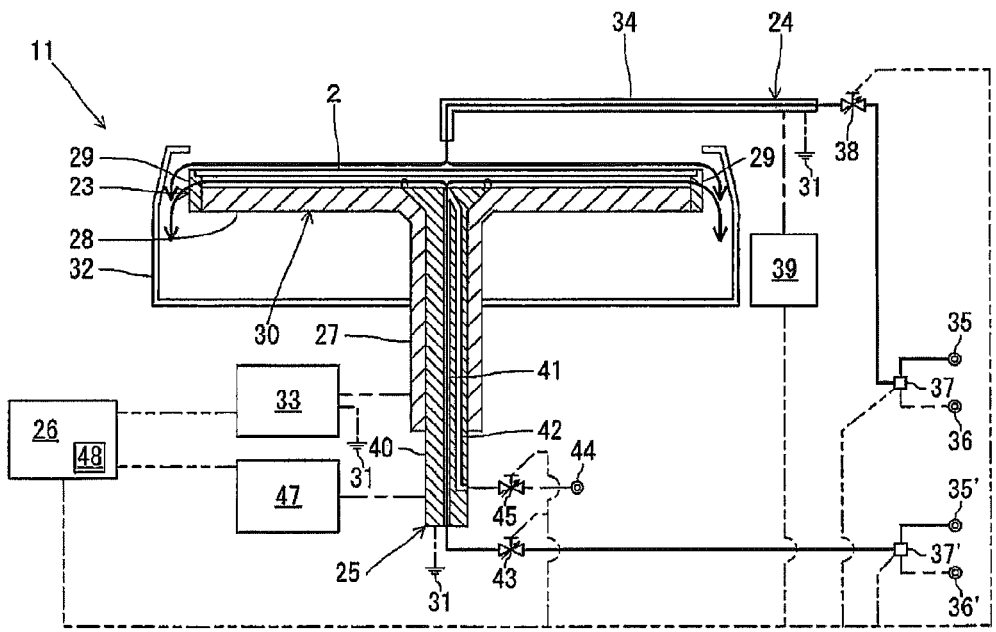
FIG. 5 is a diagram illustrating the operation of the preliminary process of FIG. 2.

Thereafter, as shown in FIG. 5, the substrate liquid processing program controls rotating driver 33 by controller 26 to rotate substrate 2 maintained by base 30 of substrate maintaining device 23 and substrate maintaining body 29 of base 30. The substrate liquid processing program then controls moving part 39 by controller 26 to move first processing liquid ejecting tube 34 to the upper center portion of substrate 2. Subsequently, substrate liquid processing program controls to convert converters 37, 37' to deionized water supplier side by controller 26, thereby controlling flow controller 45 to be blocked and to perform flow control of flow controllers 38, 43. The substrate liquid processing program then supplies deionized water (herein, carbon oxide is dissolved in deionized water) supplied by deionized water suppliers 35, 35' serving as a processing liquid from first and second processing liquid ejecting tubes 34, 40 of first and second processing liquid supply device 24, 25 to the center of the circuit-forming surface (an upper surface of substrate 2) and a surface opposite to the circuit-forming surface (lower surface), so that a thin film of deionized water is formed (a preliminary process) on the entire circuit-forming surface (upper surface) and the opposite surface (lower surface) of substrate 2. At this time, because the conductivity of deionized water is such that an electrostatic breakdown does not occur, the electrostatic breakdown does not occur on the circuit-forming surface of substrate 2.

By performing these operations, the preliminary process is performed to discharge the electric charges on substrate 2 by ejecting deionized water from first and second processing liquid supply devices 24, 25 to the circuit-forming surface (upper surface) and the opposite surface (lower surface) of substrate 2.

In particular, because the thin film of deionized water, which has a conductivity lower than that of a chemical liquid that is used for the processing of the circuit-forming surface after the preliminary process, is formed on the entire circuit-forming surface (upper surface) and the opposite surface (lower surface) of substrate 2, it is possible to uniformly discharge the electric charges from the entire circuit-forming surface (upper surface) and the opposite surface (lower surface) of substrate 2. Because the thin film of deionized water can prevent a direct ejection of the chemical liquid to substrate 2 when the chemical liquid is supplied in a later stage, it is possible to discharge the electric charges efficiently.

Also, because first processing liquid ejecting tube 34 of first processing liquid supply device 24 is formed with a conductive material and is electrically grounded, an electric charging of the anti-static liquid itself supplied from first processing liquid ejecting tube 34 can be prevented and the electric charge can be discharged from substrate 2 to first processing liquid ejecting tube 34 through the anti-static liquid.

Figure 6:
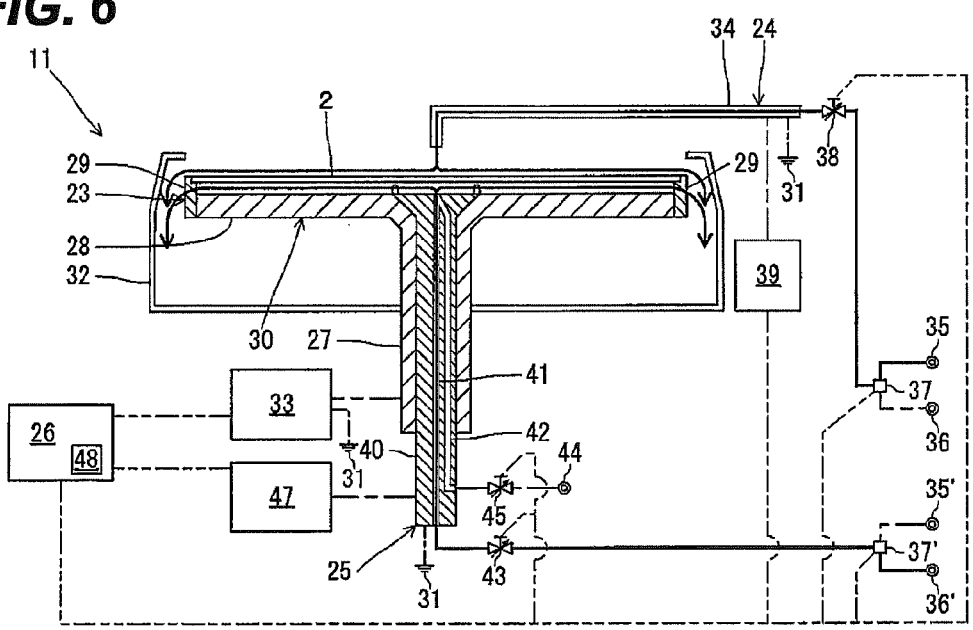
FIG. 6 is a diagram illustrating the operation of the anti-static process of FIG. 2.

Next, as shown in FIG. 6, the substrate liquid processing program controls, by controller 26, rotating driver 33, so that converter 37 is converted to deionized water supplier side and converter 37' is converted to the chemical liquid supplier side while rotating substrate 2 maintained by base 30 of substrate maintaining device 23 and substrate maintaining body 29 of base 30. Also, flow controllers 38, 45 are controlled to be blocked and the flow rate of flow controller 43 is controlled. Subsequently, the cleaning chemical liquid supplied from chemical liquid supplier 36 is supplied as an anti-static liquid from second processing liquid ejecting tube 40 of second processing liquid supply device 25 to the center of the surface opposite to the circuit-forming surface (lower surface) of substrate 2, thereby supplying the anti-static liquid to the entire surface opposite to the circuit-forming surface (lower surface) of substrate 2 (an anti-static process). By performing these processes, the remaining electric charges in substrate 2 can be discharged from the surface opposite to the circuit-forming surface (lower surface) of substrate 2 through the cleaning chemical liquid supplied from second processing liquid supply device 25, substrate maintaining body 29, base 30, and rotating axis 27.

As described above, prior to supplying the chemical liquid to the circuit-forming surface of substrate 2, the anti-static process is performed to discharge the electric charges in substrate 2 by ejecting the anti-static liquid from second processing liquid supply device 25 to the surface opposite to the circuit-forming surface (lower surface) of substrate 2. Thus, a large amount of electric charges in substrate 2 can be discharged from the surface opposite to the circuit-forming surface (lower surface) of substrate 2, and the electrostatic breakdown on the circuit-forming surface of substrate 2 can be prevented during the supply of the chemical liquid to the circuit-forming surface of substrate 2, that is performed at a later stage. At this time, deionized water having a conductivity such that the electrostatic breakdown does not occur on the circuit-forming surface of substrate 2 may be supplied from first processing liquid supply device 24 further discharging the electric charges.

In particular, because the thin film of the anti-static liquid is formed on the entire surface opposite to the circuit-forming surface (lower surface) of substrate 2, the electric charges are uniformly discharged from the surface opposite to the circuit-forming surface (lower surface) of substrate 2, thereby discharging the electric charges efficiently.

Also, because the cleaning chemical liquid is supplied from second processing liquid supply device 25, the lower surface of substrate 2 can be cleaned at the same time of the anti-static process.

Also, because substrate maintaining body 29 of substrate maintaining device 23 is formed with a conductive material and is electrically grounded, the electric charges can be discharged from substrate 2 to substrate maintaining body 29 through the anti-static liquid, and, thus, the electric charges can be readily discharged.

Also, because second processing liquid ejecting tube 40 of second processing liquid supply device 25 is formed with a conductive material and is electrically grounded, it is possible to prevent the anti-static liquid supplied from second processing liquid ejecting tube 40 from being electrically charged and to discharge the electric charges in substrate 2 to second processing liquid ejecting tube 40 through the anti-static liquid.

Figure 7:
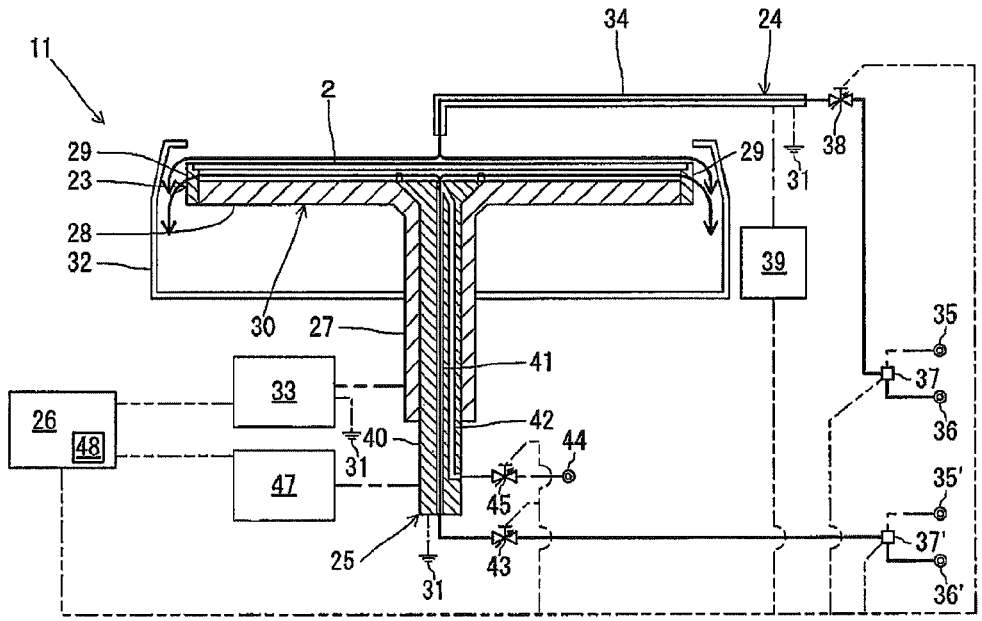
FIG. 7 is a diagram illustrating the operation of the liquid process of FIG. 2.

Next, as shown in FIG. 7, rotating driver 33 is controlled by controller 26 to rotate substrate 2 maintained by base 30 of substrate maintaining device 23 and substrate maintaining body 29 of base 30. While substrate 2 is rotating, moving part 39 is controlled by controller 26 to reciprocate first processing liquid ejecting tube 34 from the center to the peripheral edge of substrate 2. Controller 26 controls converter 37 to be converted to the chemical liquid supplier side while converting converter 37' to the chemical liquid supplier side. Also, flow controller 45 is controlled to be blocked, and the flow rate control of flow controllers 38 is performed, 43, so that a liquid process (a cleaning process) of the circuit-forming surface (upper surface) of substrate 2 is performed with a substrate processing liquid by ejecting the cleaning chemical liquid supplied from chemical liquid suppliers 36, 36' as the substrate processing liquid, from first processing liquid ejecting tube 34 of first processing liquid supply device 24 to the center of the circuit-forming surface (upper surface) of substrate 2. Also, a liquid process (a cleaning process) of the lower surface of substrate 2 is performed by ejecting the cleaning chemical liquid as a substrate processing liquid from second processing liquid ejecting tube 40 to the center of the surface opposite to the circuit-forming surface (lower surface) of substrate 2.

As described above, in substrate liquid processing apparatus 1, prior to the liquid process for processing the circuit-forming surface (upper surface) of substrate 2 with a substrate processing liquid, the electric charges in substrate 2 are discharged by an anti-static process and a preliminary process.

Thus, in substrate liquid processing apparatus 1, during an anti-static process and a preliminary process performed prior to the liquid process, the electric charges in substrate 2 can be discharged to the extent that an electrostatic breakdown does not occur on the circuit-forming surface when the chemical liquid is supplied to the circuit-forming surface, and it is possible to prevent the electrostatic breakdown on the circuit-forming surface (upper surface) of substrate 2 during the liquid process.

Figure 8:
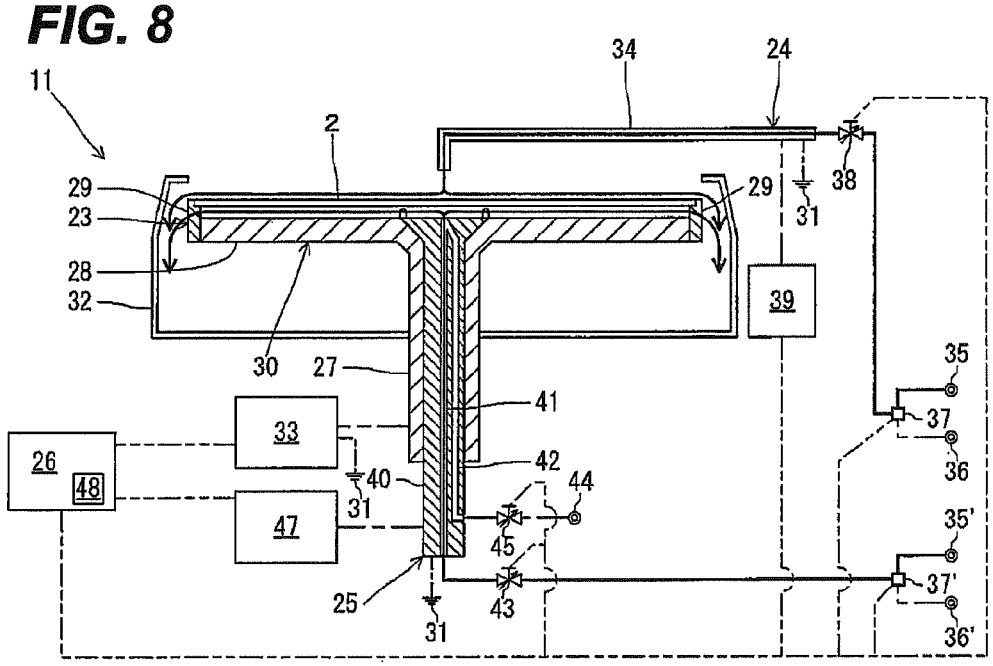
FIG. 8 is a diagram illustrating the operation of the rinsing process of FIG. 2.

Thereafter, as shown in FIG. 8, while rotating substrate 2 maintained by base 30 of substrate maintaining device 23 and substrate maintaining body 29 of base 30, the substrate liquid processing program controls rotating driver 33 by controller 26 to control converters 37, 37' to be converted to the deionized water supplier side, to control flow controller 45 to be blocked, and to perform the flow rate control of flow controllers 38, 43, so that the circuit-forming surface (upper surface) of substrate 2 is rinsed with a rinse liquid (first half of a rinsing process (a rinse liquid process)) by ejecting deionized water supplied by deionized water supplier 35 as the rinse liquid from first processing liquid ejecting tube 34 of first processing liquid supply device 24 to the center of the circuit-forming surface (upper surface) of substrate 2. And, a rinsing process of the lower surface of substrate 2 is also performed by ejecting deionized water as the rinse liquid from second processing liquid ejecting tube 40 to the center of the surface opposite to the circuit-forming surface (lower surface) of substrate 2.

Figure 9:
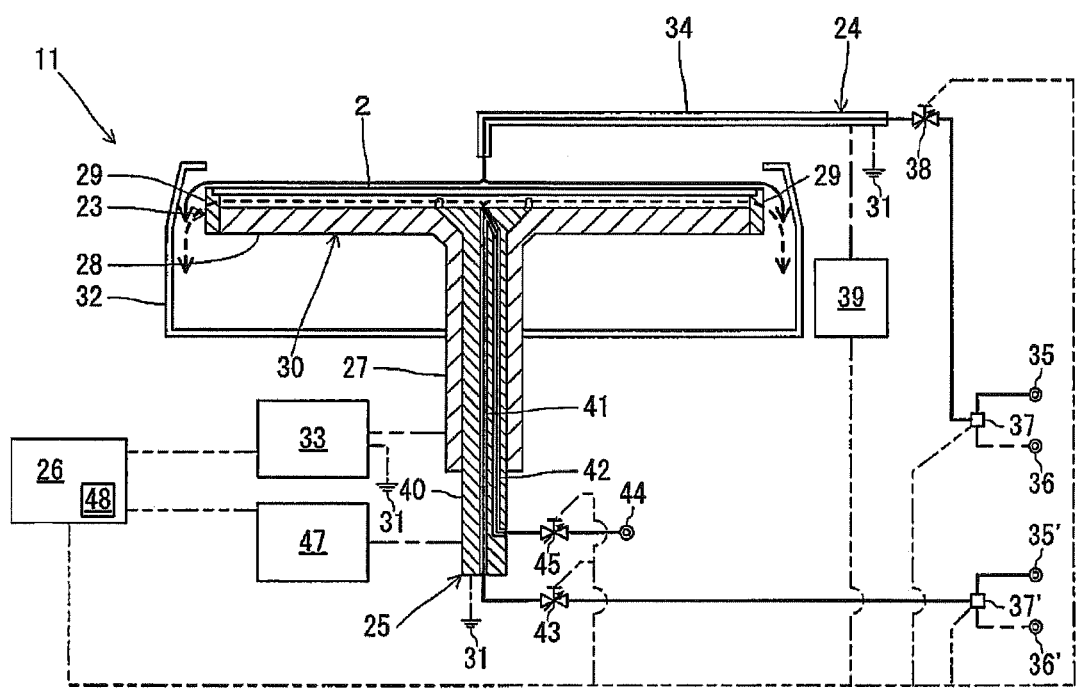
FIG. 9 is a diagram illustrating the operation of the mist process of FIG. 2.

As shown in FIG. 9, in the second half of the rinsing process, while rotating substrate 2 maintained by base 30 of substrate maintaining device 23 and substrate maintaining body 29 of base 30 by controlling rotating driver 33 by controller 26, the substrate liquid processing program controls control converters 37, 37' by controller 26 to be converted to the deionized water supplier side, controls flow controller 45 to be blocked, and controls the flow rate control of flow controllers 38, 43, 45, so that a mist phase rinse liquid is fully filled in between the surface opposite to the circuit-forming surface (lower surface) of substrate 2 and base 30 of substrate maintaining device 23 (a second half of a rinsing process (a misting process)) by ejecting a mist phase of a mixture of deionized water supplied by deionized water supplier 35 and a gas supplied by gas supplier 36, as a rinse liquid, from second processing liquid ejecting tube 40 of second processing liquid supply device 25 to the center of the surface opposite to the circuit-forming surface (lower surface) of substrate 2, and a rinsing process of the lower surface of substrate 2 is performed by ejecting the rinse liquid from first processing liquid ejecting tube 34 to the center of the circuit-forming surface (upper surface) of substrate 2.

By performing these processes, an anti-static process is performed on substrate 2 to discharge the electric charges that may remain in substrate 2 by making the space between the surface opposite to the circuit-forming face (lower surface) of substrate 2 and base 30 of substrate maintaining device 23 full of the mist phase rinse liquid supplied from second processing liquid supply device 25. Because base 30 of substrate maintaining device 23 can get wet by the rinse liquid, the electric charges can be discharged by the mist phase rinse liquid even if base 30 is electrically charged. Thus, substrate 2 to be processed next may not be electrically charged by base 30.

As described above, in substrate liquid processing apparatus 1, after the liquid process is performed on substrate 2 for processing the circuit-forming surface (upper surface) of substrate 2 with a substrate processing liquid, the rinsing process is performed for rising substrate 2 with the mist phase rinse liquid. And, then, the anti-static process is performed with the mist phase rinse liquid in the rinsing process for discharging the electric charges in substrate 2 or base 30, which is one element of substrate liquid processing apparatus 1.

Thus, the constitutional elements of substrate liquid processing apparatus 1 are not electrically charged during a next liquid process of substrate 2, and it is possible to prevent an electrostatic breakdown on substrate 2.

Thereafter, the substrate liquid processing program controls flow controllers 38, 43, 45 to be blocked by controller 26, so that first and second processing liquid ejecting tubes 34, 40 stop ejecting a liquid phase rinse liquid and a mist phase rinse liquid. The substrate liquid processing program then controls rotating driver 33 by controller 26 to rotate substrate 2 maintained by base 30 of substrate maintaining device 23 and substrate maintaining body 29 of base 30 with a high speed, so that the rinse liquid remained in substrate 2 is removed from substrate 2 and substrate 2 is dried out (a drying process).

Finally, as shown in FIG. 3, the substrate liquid processing program controls moving part 39 by controller 26 to retreat first processing liquid ejecting tube 34 to the outer side than the peripheral edge of the substrate. The substrate liquid processing program then controls elevator 47 by controller 26 to elevate second processing liquid ejecting tube 40 serving as a substrate transferring part, so that substrate 2 is delivered from substrate maintaining device 23 to substrate transfer device 10 (a substrate delivery process).

As explained above, in substrate liquid processing apparatus 1, prior to the liquid process for processing the circuit-forming surface of substrate 2 with a substrate processing liquid, the anti-static process is performed for discharging the electric charges in substrate 2 by processing the surface opposite to the circuit-forming surface of substrate 2 with an anti-static liquid. As a result, it is possible to prevent an electrostatic breakdown due to the discharge of substrate 2 and the yield of substrate liquid processing apparatus 1 may be improved.

Also, as the anti-static liquid, a liquid with a conductivity higher than or the same as the substrate processing liquid (a cleaning chemical liquid) is used for processing the circuit-forming surface of substrate 2. When a liquid with conductivity higher than or the same as the substrate processing liquid is used for processing the circuit-forming surface of substrate 2 as the anti-static liquid, the electric charges in substrate 2 may be effectively discharged from the surface opposite to the circuit-forming surface of substrate 2 prior to processing with the substrate processing liquid. As a result, it is possible to prevent the circuit-forming surface of substrate 2 from being discharged during the processing of substrate 2. Also, because a preliminary process is performed to form a thin film of deionized water having a lower conductivity than the anti-static liquid, it is possible to slowly discharge the electric charges from substrate 2. Also, because the thin film of deionized water functions as a protective film, it is possible to prevent the occurrence of discharge caused by a direct ejection of the substrate processing liquid to substrate 2.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate liquid processing method comprising:
   processing a substrate with a chemical liquid supplied from a first processing liquid supply device toward a circuit-forming surface of the substrate; and
   prior to the processing step, ejecting an anti-static liquid from a second processing liquid supply device toward a surface opposite to the circuit-forming surface thereby performing an anti-static process on the surface opposite to the circuit-forming surface prior to the processing step emitting electric charges exist inside of the substrate from the surface opposite to the circuit-forming surface of the substrate.

2. The substrate liquid processing method according to claim 1, further comprising, prior to the anti-static process, performing a preliminary process in which a deionized water serving as a processing liquid is supplied toward the substrate while rotating the substrate thereby forming a thin film of the deionized water on the surface of the substrate.

3. The substrate liquid processing method according to claim 2, wherein the conductivity of the deionized water is lower than that of the anti-static liquid.

4. The substrate liquid processing method according to claim 1, wherein the conductivity of the anti-static liquid is the same as or higher than that of the chemical liquid used for processing the circuit-forming surface of the substrate.

5. The substrate liquid processing method according to claim 4, wherein the anti-static liquid is the chemical liquid used for processing the circuit-forming surface of the substrate.

6. The substrate liquid processing method according to claim 1, further comprising ejecting a mist phase of a mixture of a rinse liquid for rising the substrate and a gas from the second processing liquid supply device toward a surface opposite to the circuit-forming surface of the substrate, after the processing step.

* * * * *